United States Patent

Furusawa

[11] Patent Number: 5,154,773
[45] Date of Patent: Oct. 13, 1992

[54] VAPOR PHASE EPITAXIAL GROWTH APPARATUS HAVING EXHAUST UNIT FOR REMOVING UNWANTED DEPOSIT

[75] Inventor: Takayuki Furusawa, Ooita, Japan

[73] Assignee: Kabushiki Kaisha Toshiba, Kawasaki, Japan

[21] Appl. No.: 739,502

[22] Filed: Aug. 2, 1991

[30] Foreign Application Priority Data

Aug. 10, 1990 [JP] Japan ................... 2-210324

[51] Int. Cl.$^5$ ............................... C23C 16/46
[52] U.S. Cl. .................. 118/724; 118/719; 156/345
[58] Field of Search ........... 118/724, 715, 719; 156/345; 134/1

[56] References Cited

U.S. PATENT DOCUMENTS 4,632,060 12/1986 Goto et al. ............ 118/715 X
4,786,352 11/1988 Benying ............... 156/345

FOREIGN PATENT DOCUMENTS 63-152117 6/1988 Japan .................. 118/715

Primary Examiner—David A. Simmons
Assistant Examiner—Jonathan D. Baskin
Attorney, Agent, or Firm—Finnegan, Henderson, Farabow, Garrett & Dunner

[57] ABSTRACT

A vapor phase growth apparatus has a reaction chamber including a suscepter on which a plurality of semiconductor wafers are mounted, a first exhaust unit arranged under the lower portion of the reaction chamber, a second exhaust unit arranged under the first exhaust unit, and a separator provided between the first and second exhaust units so as to be openable and closable. After the reaction chamber and the second exhaust unit are placed in a communicating state with each other by opening the separator, a reaction gas is introduced into the reaction chamber so as to form a film on the wafers. Prior to the next film formation, the second exhaust unit is placed in a non-communicating state with the first exhaust unit to purge the interior of the reaction chamber. Simultaneous with the purging, the deposit on the bottom of the second exhaust unit is removed by supplying to the second exhaust unit a gas for decomposing the deposit.

8 Claims, 3 Drawing Sheets

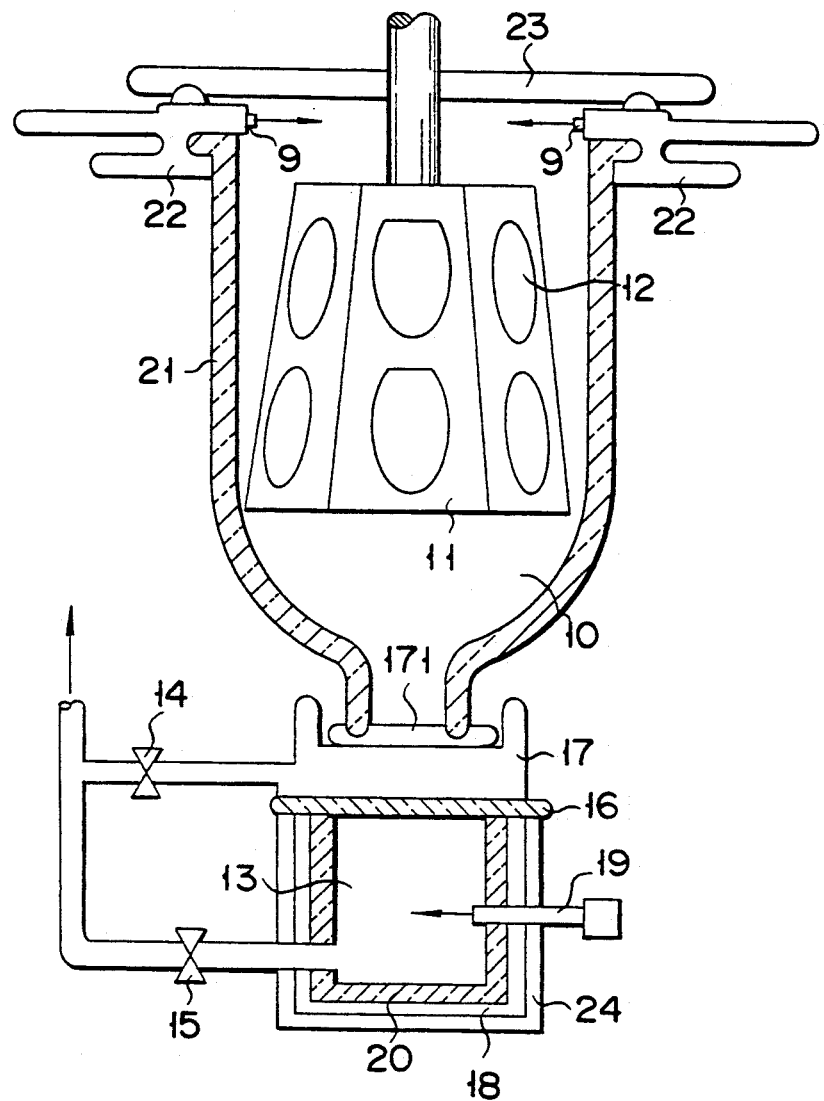
F I G. 1

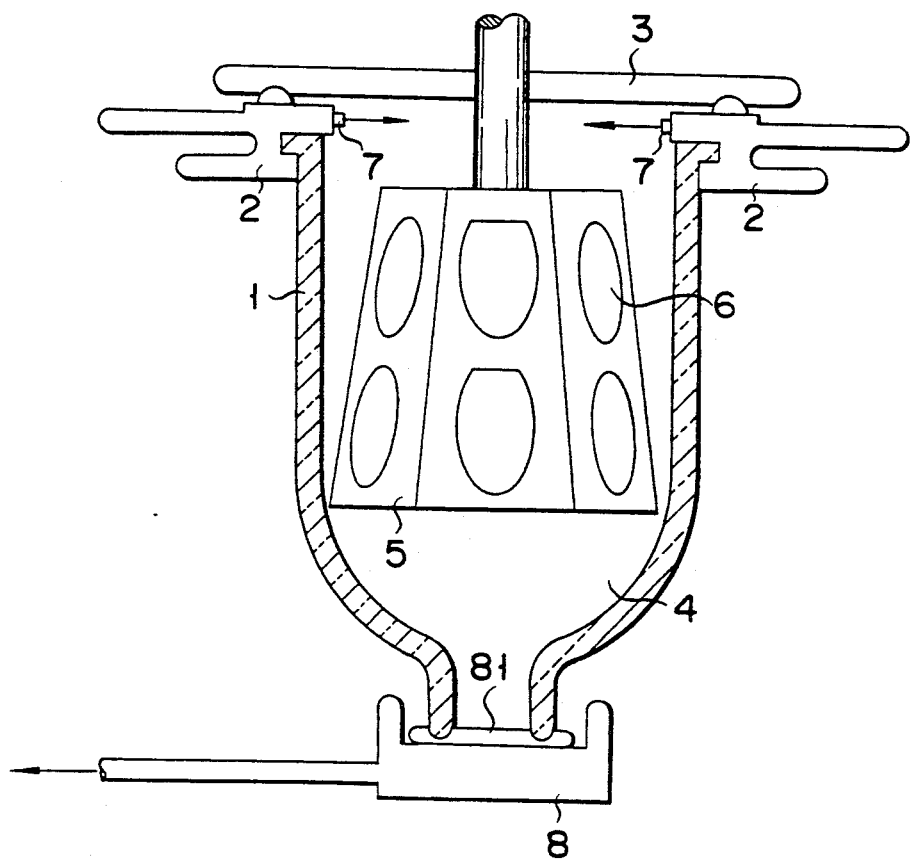
F I G. 4

VAPOR PHASE EPITAXIAL GROWTH APPARATUS HAVING EXHAUST UNIT FOR REMOVING UNWANTED DEPOSIT

BACKGROUND OF THE INVENTION

1. Field of the Invention

The present invention relates to a vapor phase growth apparatus, and more particularly to a vertical type vapor phase growth apparatus which has an unit for removing an unwanted deposit.

2. Description of the Related Art

Vapor phase growth techniques are necessary in process techniques for making semiconductor devices. These techniques have been used for providing a single-crystal semiconductor film (an epitaxial film) or an insulating film (e.g. $SiO_2$, $Si_3N_4$, or $Al_2O_3$) on a substrate such as a silicon semiconductor.

Vapor phase growth apparatus are classified by heating systems of substrates, pressure states within reaction chambers during film formation, and also classified by energy sources such as plasma, ultraviolet rays, or laser beams. The apparatus may be further classified by types of reaction chambers such as lateral or vertical types. FIG. 4 is a cross-sectional view of a conventional vertical-type vapor phase growth apparatus. This apparatus is most commonly used because its throughput per unit time is satisfactory and its performance for forming uniform films is excellent. A reaction chamber 1 has an upper open-end portion, and a gas supply unit 2 for supplying a reaction gas to the reaction chamber 1 is gastightly secured to the upper open-end portion. The upper end of the gas supply unit 2 is gastightly closed by a cover 3. Reference numeral 4 represents the inside of the reaction chamber 1. A rotatable cylinder-type suscepter 5 is attached to the cover 3. When the cover 3 is arranged so as to seal the gas supply unit 2, the suscepter 5 is placed at an appropriate position within the reaction chamber 1. Fourteen semiconductor wafers 6 of e.g. silicon are mounted on the outer surface of the suscepter 5. The number of wafers which can be mounted on the suscepter 5 depends upon the size of the wafers. Heating means (not shown) is provided inside or outside the reaction chamber 1. For example, a reaction gas is heated using halogen lamps. In place of the heating means, high frequency heating may also be used. An exhaust unit 8 including a water jacket 81 is arranged under the lower portion of the reaction chamber 1. The gas supply unit 2, which is arranged on the upper portion of the reaction chamber 1, is provided with two gas supply nozzles 7 through which a reaction gas is introduced into the reaction chamber together with a carrier gas containing $N_2$ or $H_2$. Dichlorosilane ($SiH_2Cl_2$), trichlorosilane ($SiHCl_3$), silane ($SiH_4$), and silicon tetrachloride ($SiCl_4$) are used as the reaction gas. According to demand, diborane, arsine, stibine, phosphine, or another required substance is added to the reaction gas as an impurity material to be added to the films formed by vapor phase growth. The reaction gas introduced into the reaction chamber 1 flows along the outer surface of the suscepter due to gravitation, etc. Thermal decomposition occurs on the outer surface of the suscepter 5 in the atmosphere heated by the heating means provided outside the reaction chamber, thereby providing an epitaxial film on the wafers 6. After the thermal decomposition, the reaction gas is discharged through the exhaust unit 8 arranged under the lower portion of the reaction chamber 1.

In the vapor phase growth apparatus described above, a part of the reaction gas is solidified depending upon a change in the composition ratio or the ambient temperature, and is deposited on the lower portion of the reaction chamber 1. It may be considered that the unwanted deposit has a composition including Si, Cl, $O_2$, etc., irregularly mixed. During film formation, the deposit is agitated and swirls upward within the reaction chamber 1, adhering to the surfaces of the wafers 6. Since the film formation process is repeated over and over, the number of particles adhering to the films increases, with the result that crystal defects, such as stacking faults, pits, etc., may occur in the films, thus preventing the formation of a high quality film, as can be seen in FIG. 3, which shows film characteristics obtained as the result of experiments after the film formation processes.

In FIG. 3, the axis of abscissa indicates the number of the film formation processes, and the axis of ordinate represents the number of particles deposited on one wafer (W) and the number (density) of crystal defects per sq. centimeter on the wafer. In the experiments, only those particles having diameters equal to or greater than 0.2 μm are checked, since extremely small particles cannot be detected. Fourteen silicon wafers 6, each having a diameter of 150 mm, are mounted on the suscepter 5, and processed in one batch. The reaction gas, composed of dichlorosilane (600 ml/min) and the dopant gas (200 ml/min: phosphine $PH_3$) of the impurity material, is introduced into the reaction chamber 1 through the gas supply nozzles 7. As can be seen in FIG. 3, the number of particles are increased only very slightly from the first processing to the fifth processing. However, after the fifth processing, the number of particles are increased considerably as the film formation process is repeated. No crystal defects are detected until the fourth processing. However, after the fourth processing, the number of crystal defects are increased considerably. Thus, the characteristics of the films are degraded as the film formation process is repeated.

Therefore, when the crystal defects and the amount of the particles are increased to an unacceptable degree, the unwanted deposit has been removed from the wafer surface, using a strong acid such as hydrogen fluoride.

As one of reasons why the deposit, which is a by-product of the reaction gas, is provided on the wafers, it may be considered that there is an effect of the electrostatic charge generated during the film formation. However, the electrostatic charge generated can be eliminated by heating the reaction chamber to 500° to 700° C. By eliminating the static electricity, the adhesion of the deposit to the wafers is reduced.

As can be understood from the above, a conventional vapor phase growth apparatus has the disadvantages that crystal defects in films and particles adhering to wafers are increased due to the deposit produced as a result of a part of the solidified reaction gas. The cleaning treatment for removing the deposit by means of the strong acid such as hydrogen fluoride requires that the film formation be stopped for every batch processing, thereby making continuous formation of films impossible, which inhibits improvement of the throughput. In addition, hydrogen fluoride or the like is highly corrosive, and the cleaning treatment using the same is limited in conditions. Therefore, such a cleaning treatment is not practical from an industrial point of view.

SUMMARY OF THE INVENTION

It is, therefore, an object of the present invention to provide a vapor phase growth apparatus for forming uniform films free from crystal defects and particles.

It is another object of the present invention to provide a vapor phase growth apparatus capable of continuously performing film formation.

According to one aspect of the present invention, there is provided a vapor phase growth apparatus having a reaction chamber including a susceptor on which a plurality of wafers are mounted, a first exhaust unit arranged under the lower portion of the reaction chamber, a second exhaust unit arranged under the first exhaust unit, and a separator provided between the first and second exhaust units so as to be openable and closable. After the reaction chamber and the second exhaust unit are placed in a communicating state with each other by opening the separator, a reaction gas is introduced into the reaction chamber so as to form a film on the wafers. Prior to the next film formation, the second exhaust unit is placed in a non-communicating state with the first exhaust unit to purge the interior of the reaction chamber. Simultaneous with the purging, an unwanted deposit on the bottom of the second exhaust unit is removed by supplying to the second exhaust unit a gas for decomposing the deposit.

BRIEF DESCRIPTION OF THE DRAWINGS

The novel and distinctive features of the invention are set forth in the claims appended to the present application. The invention itself, however, together with further objects and advantages thereof, may best be understood by referring to the following description and accompanying drawings, in which:

FIG. 1 is a cross-sectional view of a vapor phase growth apparatus according to an embodiment of the present invention;

FIG. 4 is a cross-sectional view of a conventional vapor phase growth apparatus.

DETAILED DESCRIPTION OF THE PREFERRED EMBODIMENTS

Figure 2:
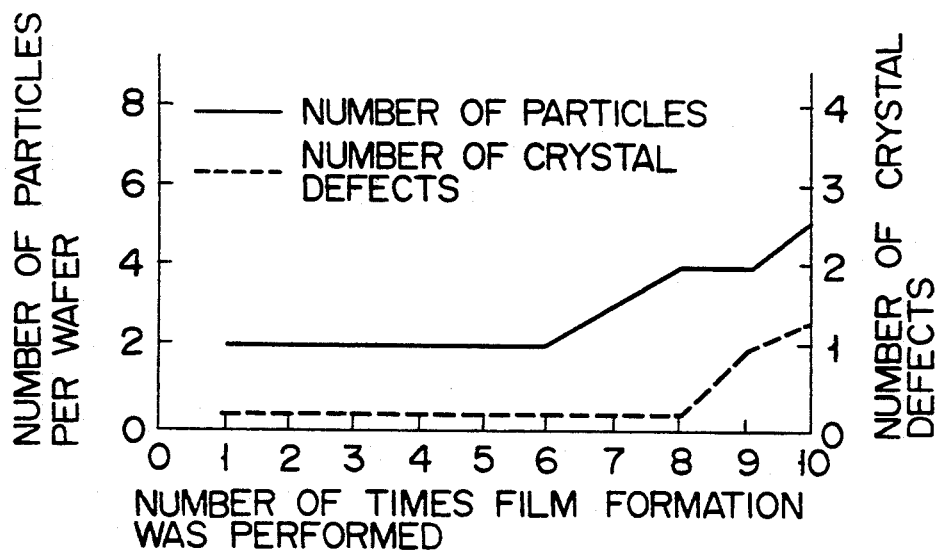
FIG. 2 is a graph showing the characteristics of films formed by the vapor phase growth apparatus of the present invention.

An embodiment of the present invention will now be described with reference to FIGS. 1 and 2. FIG. 1 shows in cross section the main part of a vertical type vapor phase growth apparatus according to an embodiment of the present invention. FIG. 2 is a graph showing the characteristics of the films formed by this apparatus using vapor phase growth techniques.

A gas supply unit 22 is gastightly attached to an upper open-end portion of a reaction chamber 21 of quartz glass, and the opening of the reaction chamber 21 is gastightly covered with a cover 23. Reference numeral 10 represents the inside of the reaction chamber 21. A rotatable cylinder-type susceptor 11, on the outer surface of which silicon wafers 12 are mounted, is attached to the cover 23. The apparatus is provided with a heating means (not shown) such as halogen lamps, for example, which is located outside the reaction chamber 21. This heating means may be provided inside the reaction chamber 21. In place of the heating means, for example, high-frequency heating means or resistance heating means may be used. The gas supply unit 22 is provided with two gas supply nozzles 9, through which a reaction gas is introduced into the reaction chamber 21 such that it flows along the outer surface of the susceptor 11. Described in the above is the structure of the upper portion of the apparatus. The structure is, however, substantially the same as that of the conventional apparatus.

The present invention is characterized by the exhaust structure provided at the lower portion of the apparatus. To be specific, a first exhaust unit 17 including a water jacket 171 is provided under the lower open-end portion of the reaction chamber 21. This exhaust unit 17 has the same structure as that used in the aforementioned conventional apparatus. A second exhaust unit 13, for discharging the reaction gas from the reaction chamber 21 and for collecting and removing an unwanted deposit produced in the reaction chamber, is provided under the first exhaust unit 17. A separator 16, made of e.g. quartz glass or ceramics, is interposed between the first and second exhaust units. The separator 16 is capable of blocking, when needed, communication between the reaction chamber 21 and the second exhaust unit 13. The second exhaust unit 13 includes a container 20 made of e.g. quartz glass, a heater 18 surrounding the container 20, and a water jacket 24 surrounding the heater 18 so as to prevent overheating. A gas for removing the deposit is introduced into the second exhaust unit 13 through a gas supply nozzle 19 made of e.g. quartz glass. The second exhaust unit 13 communicates with an exhaust pipe, which has a valve 15 and communicates with a pipe having a valve 14. The heater 18 is of a resistance-heating type, but is not limited to this type, and a heater of another type may be employed.

Using the apparatus explained above, a film formation process is carried out a number of times under the same condition as that in the case of the film formation repeatedly performed using the aforementioned conventional apparatus. More precisely, the film formation process is repeated under the following condition:

Number of wafers processed in one batch: 14
Diameter of each wafer: 150 mm
Reaction gas: dichlorosilane ($SiH_2Cl_2$); 600 ml/min
Dopant gas: phosphine ($PH_3$); 200 ml/min
Time required for epitaxial growth: 10 minutes P-type silicon substrates are used as the wafers. The reaction gas containing the dopant gas is introduced into the reaction chamber 21 through the gas supply nozzles 9 together with a reducing gas containing $N_2$ and $H_2$ so as to flow along the outer surface of the susceptor 11 on which wafers (P-Si) 12 are mounted. These wafers 12 are heated to approx. 1100° C. by the lamp provided outside the reaction chamber 21, such that a silicon single-crystal film is grown on the wafers 12 by the reaction gas. Since phosphine is used as the dopant gas, N-type film is grown on the wafers. The gas after reaction is discharged through the second exhaust unit 13 provided below the lower end of the reaction chamber. During film formation, the valve 14 is kept closed and the valve 15 is kept open, so as to allow the reaction gas to be discharged through the second exhaust unit 13. Consequently, a deposit, produced as a result of a part of the solidified reaction gas is accumulated on the bottom of the second exhaust unit 13. Then, the first processing is finished, and the second processing is performed.

However, as mentioned before, the inside of the second exhaust unit 13 is contaminated by the first processing. Accordingly, prior to the second processing, the second exhaust unit 13 must be cleaned in the following manner. First of all, the separator 16 is closed to block the communication between the second exhaust unit 13 and the inside 10 of the reaction chamber 21. Then, the second exhaust unit 13 is heated to 200° C. by the heater 18, in which state hydrogen chloride gas is supplied for approx. five minutes through the gas supply nozzle 19 of quartz glass, with the valve 15 kept open. As a result, the deposit in the second exhaust unit 13 is decomposed and gasified so as to be discharged therefrom. (The gas used for decomposing the deposit is not limited to hydrogen chloride, and a gas containing chloride or fluorine may be used in place of hydrogen chloride.)

Further, in order to form uniform films, it is necessary, before the second processing, to eliminate from the reaction chamber 21 the influence of the gas used in the first processing. Accordingly, a purge treatment is accomplished using the first exhaust unit 17 and the gas containing $N_2$ and $H_2$. To enable use of the first exhaust unit 17, separator 16 is closed and the valve 14 is opened. During the purge treatment using the first exhaust unit 17, no reaction occurs and therefore no deposit is produced, so that the reaction chamber 21 is not contaminated. (It takes on the order of 20 minutes to purge the reaction chamber 21.)

The cleaning of the second exhaust unit 13 and purging of the reaction chamber 21 are carried out as a pretreatment before each time the film formation process is performed. The second exhaust unit 13 is cleaned while the reaction chamber 21 is being purged. When the purging of the reaction chamber 21 is finished, the second exhaust unit 13 is ready for use, enabling continuous formation of films.

Figure 3:
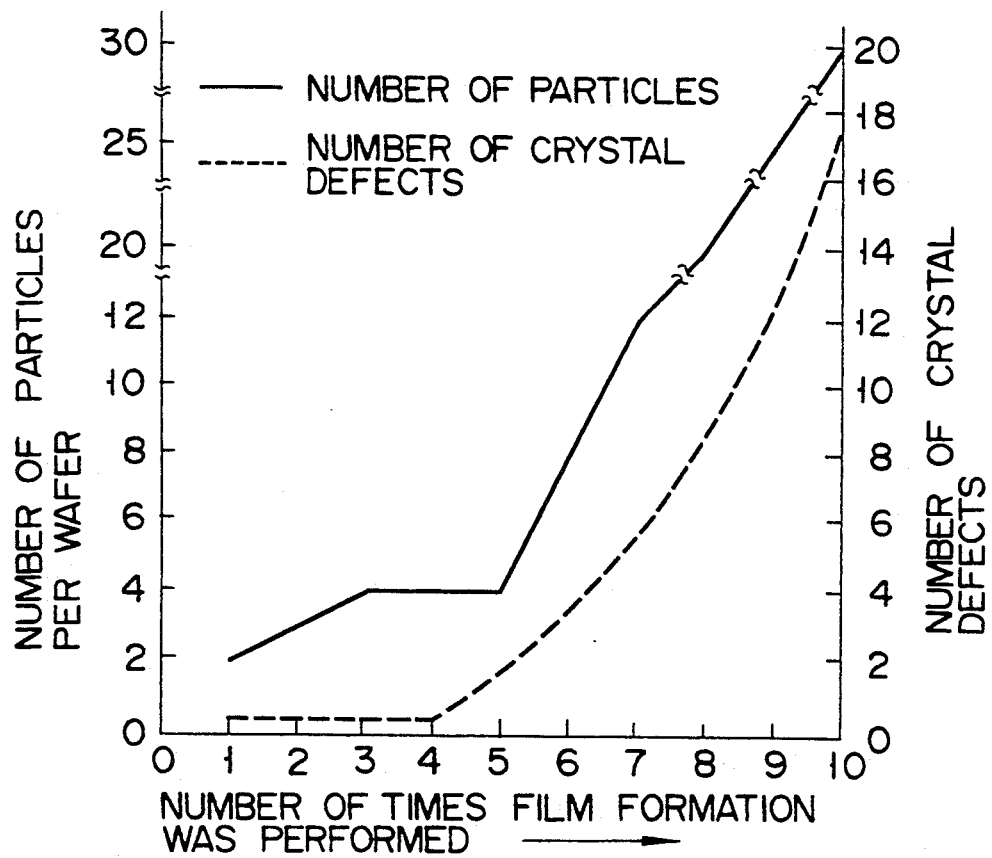
FIG. 3 is a graph showing the characteristics of films formed by a conventional vapor phase growth apparatus.

FIG. 2 is a graph showing the characteristics of the films which have been formed by the apparatus of the present invention. In this graph, as in FIG. 3, the axis of abscissa indicates the number of the repeated film formation processes, and the axis of ordinate represents the number of particles deposited on one wafer (W) and the number (density) of crystal defects per sq. centimeter on the wafer. As seen in FIG. 2, no changes occurs in the characteristics of the films until after the sixth processing. The degree of degradation in the characteristics of the films after film formation is repeated ten times is reduced to 1/10 that in the characteristics of the films formed by the conventional apparatus.

In the present invention, the gas produced as a result of the gasification of the deposit can be used as a reaction gas after appropriate adjustment. Moreover, the present invention is not limited to a vertical-type apparatus, and is applicable to any type of apparatus by virtue of the separator 16 provided between the second exhaust unit 13 and the first exhaust unit 17.

In addition, the reaction gas is not limited to dichlorosilane, and all of the conventionally used gases such as trichlorosilane, silane, and silicon tetrachloride can be used in the present invention In the above embodiment, the temperature in the second exhaust unit 13 is at 200° C. The optimum range of the temperature is of the order of 50° to 500° C., whose temperature is determined by the kind of reaction gas used, the amount of the deposit, and the chemical composition of the deposit.

According to the present invention, uniform films free from crystal defects and particles can be continuously provided.

It is further understood by those skilled in the art that the foregoing description is the preferred embodiment and that various changes and modifications may be made in the present invention without departing from the spirit and scope thereof.

What is claimed is:

1. A vapor phase growth apparatus comprising:
a reaction chamber;
a suscepter for disposing a plurality of wafers, said suscepter being located in said reaction chamber;
means for introducing a reaction gas into said reaction chamber to provide a film on said wafers;
a first exhaust unit arranged under a lower portion of said reaction chamber;
a second exhaust unit arranged under said first exhaust unit; and
a separator provided between said first and second exhaust units so as to be openable and closable.

2. An apparatus according to claim 1, wherein said first exhaust unit includes an exhaust pipe having a valve.

3. An apparatus according to claim 1, wherein said second exhaust unit has an exhaust pipe having a valve.

4. An apparatus according to claim 1, wherein said second exhaust unit includes a container, a heater surrounding said heater.

5. An apparatus according to claim 1, wherein after said first exhaust unit is placed in a non-communicating state with said second exhaust unit, a reducing gas is supplied to said reaction chamber to perform a purge treatment.

6. An apparatus according to claim 5, wherein said first exhaust unit discharges said reducing gas.

7. An apparatus according to claim 1, wherein after said reaction chamber and said second exhaust unit are placed in a communicating state with each other by opening said separator, a deposit produced by said reaction gas accumulates on the bottom of said second exhaust unit.

8. An apparatus according to claim 7, wherein a gas for decomposing said deposit is supplied to said second exhaust unit.

* * * * *